United States Patent
Barth

(10) Patent No.: US 6,893,959 B2
(45) Date of Patent: May 17, 2005

(54) METHOD TO FORM SELECTIVE CAP LAYERS ON METAL FEATURES WITH NARROW SPACES

(75) Inventor: Hans-Joachim Barth, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/429,470

(22) Filed: May 5, 2003

(65) Prior Publication Data

US 2004/0224497 A1 Nov. 11, 2004

(51) Int. Cl.$^7$ ............................................ H01L 21/4763
(52) U.S. Cl. ........................ 438/637; 438/638; 438/672; 438/700
(58) Field of Search ................................ 438/673–675, 438/637–639, 700

(56) References Cited

U.S. PATENT DOCUMENTS

| | | | |
|---|---|---|---|
| 5,674,787 A | 10/1997 | Zhao et al. | |
| 6,235,579 B1 * | 5/2001 | Lou | 438/253 |
| 6,579,785 B2 * | 6/2003 | Toyoda et al. | 438/597 |
| 2002/0000665 A1 | 1/2002 | Barr et al. | |
| 2002/0074664 A1 | 6/2002 | Nogami et al. | |
| 2002/0100391 A1 | 8/2002 | Inoue et al. | |
| 2003/0119317 A1 | 6/2003 | Nogami et al. | |
| 2003/0228749 A1 * | 12/2003 | Sinha et al. | 438/618 |
| 2004/0175921 A1 | 9/2004 | Cowley et al. | |
| 2004/0182277 A1 | 9/2004 | Inoue et al. | |

FOREIGN PATENT DOCUMENTS

| | | |
|---|---|---|
| EP | 1 211 334 A2 | 6/2002 |
| JP | 2001284453 | 10/2001 |
| WO | WO 02/31876 A1 | 4/2002 |

OTHER PUBLICATIONS

Lopatin, et al. "Thin Electroless Barrier for Copper Films," Sep. 1998, pp. 65–77, SPIE vol. 3508, SPIE Conference on Multilevel Interconnect Technology II, Santa Clara, California.

Segawa, Y., et al., "Manufacturing–ready Selectivity of CoWP Capping on Damascene Copper Interconnects," Advanced Metallization Conference, Proceedings of the Conference, Oct. 29, 2001, pp. 567–572.

Shacham–Diamond, Y., et al., "Integrated Electroless Metallization For ULSI," Electrochimica Acta, Elsevier Science Publishers, Barking GB, vol. 44, No. 21–22, Jun. 1, 1999, pp. 3639–3649.

* cited by examiner

Primary Examiner—Dung A. Le
(74) Attorney, Agent, or Firm—Slater & Matsil, L.L.P.

(57) ABSTRACT

Interconnect layers on a semiconductor device containing logic circuits (microprocessors, Asics of others) or random access memory cells (DRAM's) are formed in a manner to significantly reduce the number of shorts between adjacent conductor/vias with narrow separations in technologies having feature sizes of 0.18 microns or smaller. This is accomplished by etching to form recessed copper top surfaces on each layer after a chemical-mechanical polishing process has been completed. The thickness of a selectively formed barrier layer on the recessed copper surfaces, is controlled to be essentially co-planar with the surrounding insulator surfaces. Because the barrier layers are recessed, shorting of adjacent conductive lines is prevented.

36 Claims, 5 Drawing Sheets

METHOD TO FORM SELECTIVE CAP LAYERS ON METAL FEATURES WITH NARROW SPACES

TECHNICAL FIELD

Embodiments of the present invention relate to integrated circuit devices using copper for interconnecting discrete circuit components as part of the processing of semiconductor devices, and more particularly, to modifications in semiconductor device processing resulting in a reduction of electrical shorts between metal lines and vias with high aspect ratios and narrow spaces.

BACKGROUND

As Ultra Large Scale Integration (ULSI) circuit density increases and device feature sizes approach 0.18 microns or less, increased numbers of patterned metal levels are required with decreasing spacing between metal lines at each level to effectively interconnect discrete semiconductor devices on the semiconductor chips. Typically, the different levels of metal interconnections are separated by layers of insulator material. These interposed insulating layers have etched holes filled with a conductive material, referred to as vias, which are used to connect one level of metal to the next. Typically, the insulating layer is silicon oxide (SiO2) having a dielectric constant k (relative to vacuum) of about 4.0 to 4.5.

However, as semiconductor device dimensions decrease and the packing density increases, it is necessary to reduce the spacing between the metal lines at each level of interconnection to effectively wire up the integrated circuits. Unfortunately, as the spacing decreases, the intralevel and interlevel capacitances increase between metal lines, because the capacitance C is inversely proportional to the spacing d between the lines. Therefore, it is desirable to minimize the dielectric constant k of the insulating material (dielectric) between the conducting lines, in order to reduce the RC time constant and thereby increase the performance of the circuit, e.g., the frequency response, since the signal propagation time in the circuit is adversely affected by the RC delay time.

To achieve an insulating layer with a dielectric constant of 3 or less, relatively porous spin-on insulating films are commonly used, such as hydrogen silsesquioxane (HSQ), a silicon polymer with a k of 2.7–3.0, and SiLK™, which is a trademark of the Dow Chemical Company, having a k of 2.65. However, these low-k insulators (low compared to silicon oxide) are usually mechanically weak and some are porous and therefore, do not provide good structural support for integration. Further, absorbed moisture and other chemicals in the porous insulator can cause corrosion of the metal lines. Low-k materials, such as, Black Diamond™, a trademark of Applied Materials, Coral™, a trademark of Novellus, SiCOH and other similar materials are used in the semiconductor industry but are deposited by CVD, which distinguishes them from the spin-on dielectrics.

Copper is the preferred metal that is used on chip multilevel interconnections (both wiring and plugs) to replace aluminum, which has a higher bulk electrical resistivity and a low resistance to electromigration. Copper can be deposited by either electrolytic or electroless deposition and also by Chemical Vapor Deposition (CVD) and Physical Vapor Deposition (PVD), as examples.

However, copper has relatively poor resistance to corrosion. Unlike other metal oxidation (such as aluminum oxidation), copper is readily oxidized to form Cu2O and CuO at relatively low temperatures, e.g., below 200 degrees C, and no self-protective oxide layer forms to prevent the copper from further oxidation. Oxidized copper degrades the electrical and mechanical properties of the copper interconnect. Accordingly, a protection, or encapsulation, e.g., diffusion barrier, layer of high corrosion resistance material is necessary to cover exposed copper surfaces.

A variety of materials are known for forming diffusion barriers on copper. Such materials include Ta, W, Mo, TiW, TiN, TaN, WN, TiSiN and TaSiN, as examples, which can be deposited by CVD or PVD. More recently, electrolessly deposited CoWP has been used as a barrier material to encapsulate a conductor material. Furthermore, the W in the CoWP significantly enhances the barrier properties.

However, in very narrow spaces like those found between first level metal lines in 0.18 or less micron technologies, if the copper diffusion barrier cap layer is selectively deposited onto the exposed copper of the previously planarized surface there is some lateral (sideways) growth which is proportional to the thickness of the selectively deposited layer. When the lateral growth exceeds half the distance between copper lines, the cap layer can make contact with the adjacent cap layer to create an electrical short. Therefore, in some technologies a very thin layer of CoWP, proposed to achieve an improvement in electromigration, would be less prone to form electrical shorts. But an extremely thin layer is insufficient as a copper diffusion barrier and therefore, an additional cap layer of, for example, SiN (Si3N4), SiC, SiCN or BlokTM (a barrier low-k insulator material developed by Applied Materials, Inc.) is required.

SUMMARY OF THE INVENTION

These and other problems are generally solved or circumvented, and technical advantages are generally achieve, by preferred embodiments of the present invention in which the conductive material is recessed prior to forming a barrier layer, eliminated the need for an additional cap layer. The above-mentioned problem, in which an insufficiently thick CoWP layer fails as a diffusion barrier to copper (Cu), necessitates the use of an additional cap layer. Embodiments of the present invention provide a method for eliminating the need for this additional cap layer and, thereby improve the overall circuit performance.

It is to be noted that the low-k dielectrics described herein may be either organic (e.g., SiLK) or inorganic (e.g., HSQ) and therefore, the term "low-k dielectrics" will be used to refer to both organic and inorganic low-k insulators herein. These 'low k-dielectrics' may be of a porous or non-porous nature. This term does not include materials, such as SiO2 or Si3N4, which have k values of about 4 and 8, respectively. However, embodiments of the present invention are not restricted to low k dielectric insulating layer; the insulating layers described herein may comprise conventional dielectric materials such as SiO2 or FSG, as examples, as well. In accordance with a preferred embodiment of the present invention, a method of forming conductive lines of a semiconductor device comprises depositing a first insulating layer over a substrate, patterning the first insulating layer with a pattern for at least one conductive line, and filling the first insulating layer pattern with a first conductive material. Excess first conductive material is removed from a top surface of the first insulating layer, the first conductive material is recessed below the top surface of the first insulating layer, and a barrier layer is selectively formed over the recessed first conductive material.

In accordance with another preferred embodiment of the present invention, a method of forming conductors over a semiconductor body having a top surface in which electrical contact areas are formed is disclosed. The method includes forming a first inorganic insulating layer having a relatively high k over the top surface, forming vias completely through the first inorganic insulating layer which are in contact with the contact areas of the semiconductor device, and filling the vias through the first inorganic insulating layer with conductive material to form conductive plugs and make contact with the contact areas. The method includes forming a first dielectric insulating layer having a relatively low-k over the first inorganic insulating layer, forming trenches in the first dielectric layer from a top surface thereof, lining the vias and trenches in the first dielectric insulating layer with a conductive barrier liner layer, and filling the vias and trenches in the first dielectric insulating layer with copper to at least a level of a top surface of the first dielectric insulating layer. A portion of the copper fill in the vias and trenches is removed to recess the copper in the vias and trenches from the top surface of the first dielectric insulating layer, and a conductive barrier layer is formed on a top surface of the copper in the vias and trenches, the conductive barrier layer having a top surface that is essentially planar with the top surface of the first low-k dielectric layer. A second dielectric insulating layer is formed, having a relatively low-k and being of the same type as the first dielectric insulating layer over the first dielectric insulating layer. Vias and trenches are formed in the second dielectric insulating layer, and these are lined with a conductive barrier liner layer, after which copper filling, copper recessing are performed, and then a barrier layer is formed over the recessed copper in essentially the same manner as was done with respect to the first dielectric insulating layer. A second inorganic layer is formed having a relatively high-k over a top surface of the last of the additional plurality of the dielectric insulating layers.

In accordance with yet another preferred embodiment of the present invention, a semiconductor device includes a first insulating layer formed over a substrate, the first insulating layer being patterned with a pattern for at least one conductive line, and a first conductive material disposed within the patterned first insulating layer, the first conductive material being recessed below a top surface of the first insulating layer. The device includes an activation layer disposed over the recessed first conductive material, and a barrier layer disposed over the activation layer, wherein the activation layer and barrier layer do not extend beyond the top surface of the first insulating layer.

Embodiments of the present invention provide technical advantages by providing improved circuit performance, which is the result of a reduction in capacitive coupling, thermo-mechanical stress and thermal budget. The thermal budget reduction is the result of a decrease in the number of processing steps, which leads to lower processing costs. The reduction in capacitive coupling is the result of an elimination of the need for an additional dielectric cap layers (i.e. dielectric diffusion barriers) over the CoWP layer, such as SiN (Si3N4), SiC, SiCN or Blok™, as examples. The elimination of these additional dielectric cap layers also reduces the effective k-value of the dielectric stack in the interconnect architecture.

The foregoing has outlined rather broadly the features and technical advantages of embodiments of the present invention in order that the detailed description of the invention that follows, taken in conjunction with the accompanying drawings and claims, may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of embodiments of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely semiconductor devices having one or more metallization layers in which conductive lines are formed to form interconnects. Processes are described herein which bear on the elimination of an inorganic cap layer by recessing the surface of the copper conductors and vias to provide for a thicker, conducting diffusion barrier while still maintaining the overall thickness requirements for the metal/insulator stack. It is to be noted that the low-k dielectrics described herein may be either organic, such as SiLK™, as an example, or inorganic, such as HSQ, and therefore, the term "low-k dielectrics" will be used to refer to both organic and inorganic low-k insulators. The low k-dielectrics may be of porous or non-porous nature. In particular, this term does not include materials such as $SiO_2$ or $Si_3N_4$, which have k values of about 4 and about 8, respectively. However, embodiments of the present invention are not restricted to low k dielectrics; they may be also implemented in structures having more traditional dielectrics like $SiO_2$ or FSG, as examples.

Figure 1:
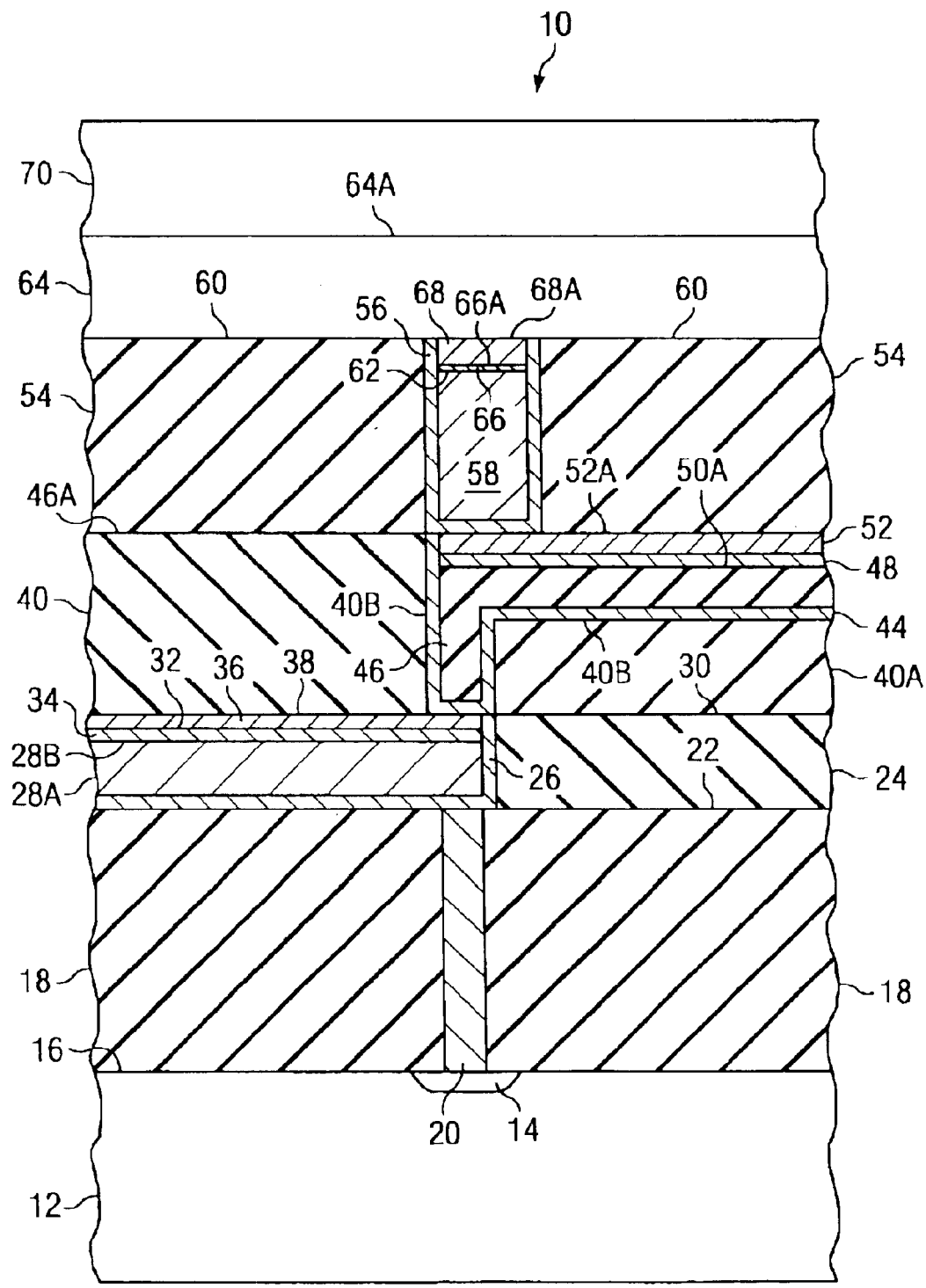
FIG. 1 illustrates a cross-section of an integrated circuit fabricated using both single and dual Damascene processes in accordance with an embodiment of the present invention.

An embodiment of the present invention will first be summarized, with reference to FIG. 1. FIG. 1 shows a cross-sectional view of a semiconductor device 10 structure which comprises a plurality of logic circuitry of a microprocessor or ASIC, or, alternatively, as an example, memory cells of a dynamic random access memory (DRAM) represented by a drain region 14 formed in a semiconductor substrate 12 in accordance with a preferred embodiment of the present invention. A first insulating (Pre-Metal Dielectric, PMD) layer 18, typically comprising silicon oxide ($SiO_2$) is deposited onto a silicon substrate surface 16 of a semiconductor substrate 12 and is patterned, lithographically, to form contact openings (not shown) which are overfilled with a first conducting layer 20, typically tungsten (W), which becomes the contact metallurgy to the semiconductor drain region 14. The surface is planarized using a chemical-mechanical polishing (CMP) process, for example, to result in an essentially planar surface 22. A low-k dielectric insulating layer (Inter-Metal Dielectric, IMD) 24, comprising a material having a low dielectric constant, for example, typically about 3.7 or less, is deposited over the first inorganic insulating layer 18. A single damascene process is used to form openings (not shown) in insulating layer 24 and the openings (trenches) are lined with a second conductor material 26, typically, of tantalum nitride (TaN) or titanium nitride (TiN), as examples. Alternatively the liner 26 may comprise Ta, W, Mo, TiW, TiN, TaN, WN, TiSiN, TaSiN, or a combination thereof, for example.

The lined openings are filled with a third conductor material 28A, typically Cu, to form conductors and to make an electrical connection to the first conductor layer 20 via the second conductor material 26. The surface is then planarized, using CMP, for example, to form a planar surface 30. The exposed copper layer 28A is etched to result in a recessed top surface 28B. A catalytic activation layer 34, typically comprising palladium (Pd), for example, is deposited over the copper top surface 28B to provide a catalytically activated copper surface. A barrier layer 36, typically comprising cobalt tungsten phosphide (CoWP) and alternatively comprising CoWB, CoP, NiMoP, Re or Ru, as examples, is deposited selectively and preferably electrolessly, onto a surface 32 of the Pd layer to form a surface 38 which is essentially co-planar with the surface 30 of the low-k dielectric layer 24.

One or more insulating layers and conductive structures may subsequently be formed, in accordance with embodiments of the present invention. For example, in FIG. 1, a low-k dielectric insulating layer 40, comprising a material having a low dielectric constant, typically k equals about 3.7 or less, is deposited over the resulting structure. Layer 40 is etched to form a dual damascene structure with both trench and via hole openings (not shown) having surfaces 40B, which are then covered with a liner layer 44, typically comprising TaN, TiN, WN or other similar materials. Alternatively the liner 44 may comprise Ta, W, Mo, TiW, TiN, TaN, WN, TiSiN, TaSiN, or a combination thereof, for example. The trench and hole openings are then overfilled with copper 46, and the surface is planarized, for example, using CMP. The planarized copper 46 is then etched to form a recessed top surface 50A. A catalytic activation layer 48, typically comprising palladium (Pd), for example, is deposited over the copper surface 50A. The Pd activation layer 48 is then covered, preferably selectively and electrolessly, with a conductive barrier layer 52, typically comprising CoWP and alternatively comprising CoWB, CoP, NiMoP, Re or Ru, as examples. An optional touch-up CMP process can be performed after the CoWP deposition to remove any CoWP overgrowth and CoWP islands (spots) on the top surface of the dielectric layer 40. It is, however, recommended that a CoWP layer having a thickness greater than 10 nm thick remains in the recessed areas above the copper line. A surface 52A of the barrier layer 52 is then essentially co-planar with the low-k dielectric insulator layer 40 surface 46A.

Again, additional insulating layers may be deposited over the structure. For example, shown in FIG. 1, a low-k dielectric insulating material having a dielectric constant of about 3.7 or less, is then deposited to form an insulating layer 54 into which a via opening (not shown) is etched. The via opening is lined with a conductor material 56, typically comprising TaN or TiN, as examples. Alternatively the liner 56 may comprise Ta, W, Mo, TiW, TiN, TaN, WN, TiSiN, TaSiN, or a combination thereof, for example. The via opening is then overfilled with layer 58, typically comprising copper, and the surface of the insulating layer 54 is planarized using CMP, for example. The exposed copper 58 is etched to form a recessed top surface 62. A catalytic activation layer 66, typically comprising Pd, for example, is deposited onto the top surface 62 layer and has a top surface 66A. A conductive barrier layer 68 is then deposited, selectively and electrolessly, onto the surface 66A forming a top surface 68A which is essentially co-planar with surface 60 of insulating layer 54. A second layer 64, typically comprising $SiO_2$, is deposited onto the resulting structure and a third inorganic layer 70, typically comprising $Si_3N_4$, is deposited onto the surface 64A. Conducting vias (not shown) are formed through layers 64 and 70 and in other layers as required to facilitate electrical contact with terminals (not shown) on a package in which the semiconductor structure 10 is housed.

Figure 2:
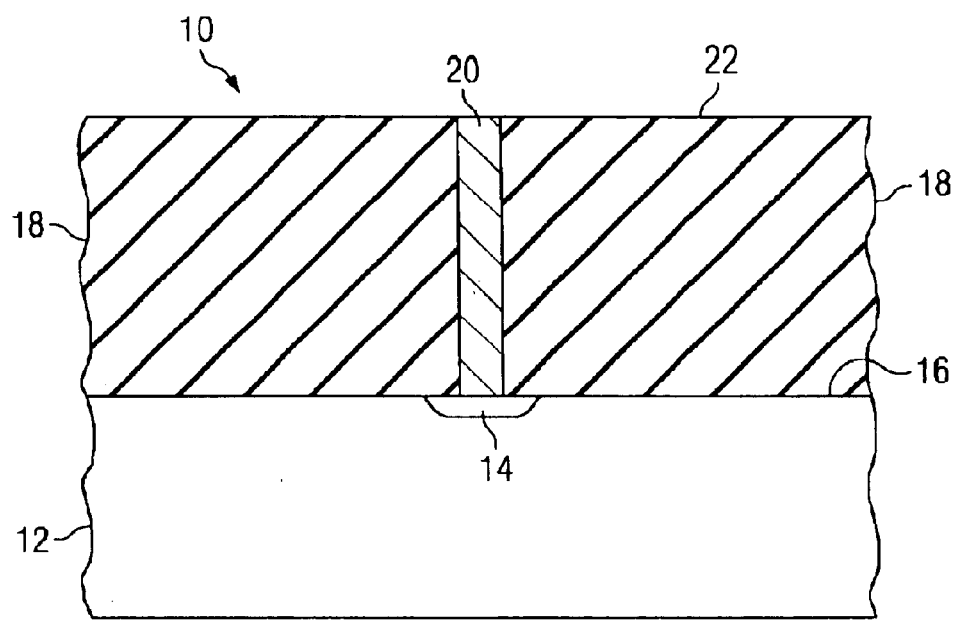
FIGS. 2-8 illustrate cross-sections of integrated circuits in which processing methods are used in accordance with embodiments of the present invention.

An embodiment of the present invention will next be described in more detail, with reference to FIGS. 2 through 8. FIG. 2 shows a cross-sectional view of a semiconductor device 10 structure at an early stage of fabrication with an element region 14 which may comprise a drain region, for example, is formed in a semiconductor substrate 12. A first inorganic insulating layer 18, typically comprising silicon oxide ($SiO_2$) and alternatively comprising B-type doped oxide, such as boron phosphosilicate glass (BPSG) or boron silicate glass (BSG), P-doped oxide, such as BPSG or phosphosilicate glass (PSG), or fluorine-doped oxide (FSG), as examples, and typically comprising a thickness of 200 nm–1000 nm, is deposited onto a silicon surface 16 of semiconductor substrate 12. The first inorganic insulating layer 18 is lithographically patterned to form contact openings, exposing a top surface of the underlying element region 14. The contact openings are filled with a first conducting layer 20, typically comprising tungsten (W), for example, and alternatively comprising other conductive material. The first conducting layer 20 becomes the contact metallurgy to the element region 14. The surface of the first inorganic insulating layer 18 is planarized, for example, using chemical-mechanical polishing (CMP) and alternatively comprising a reactive ion etch (RIE) to form a top surface 22.

Figure 3:
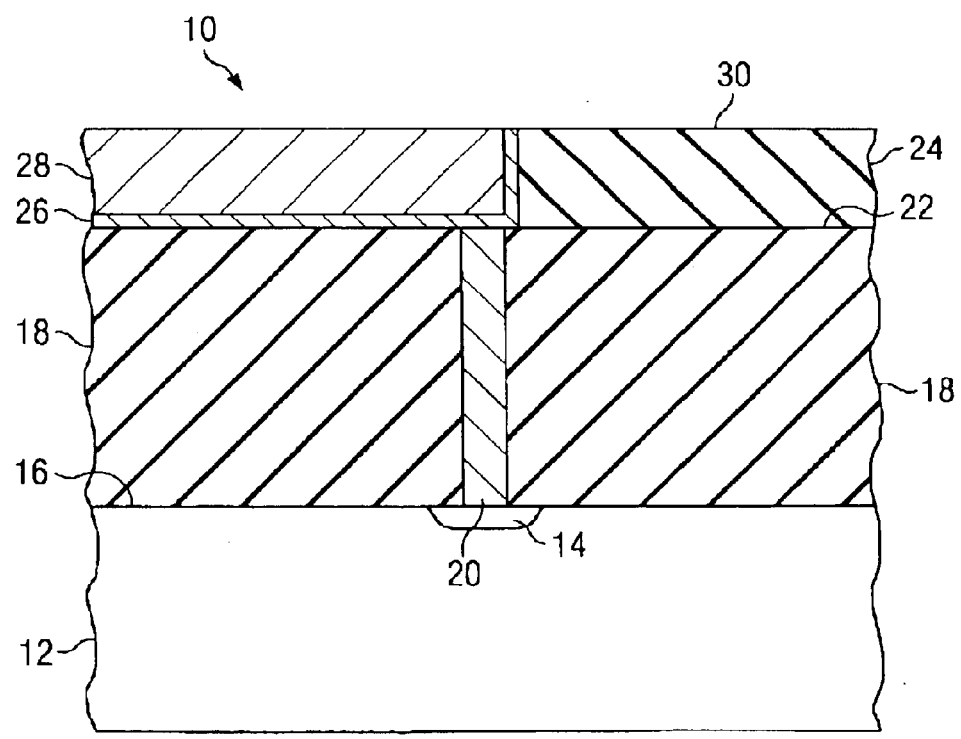

FIG. 3 shows a cross-sectional view of the semiconductor structure 10 shown in FIG. 2, in which an insulating layer 24, preferably comprising a low-k dielectric material having a dielectric constant of about 3.7 or less. For example the low-k insulating layer 24 may be deposited or spun onto the surface of the semiconductor substrate 12, e.g., over the top surface 22 of the first insulating layer 18. A single damascene process is then used to form openings in layer 24, exposing the first conductive layer 20 and portions of the first insulating layer 18. The openings are lined with a second conducting layer 26 comprising a barrier layer to the diffusion of copper. For example, the second conducting layer 26 typically comprises tantalum nitride (TaN) or titanium nitride (TiN). Alternatively the liner 26 may comprise Ta, W, Mo, TiW, TiN, TaN, WN, TiSiN, TaSiN, or a combination thereof, for example.

The opening (e.g., trench) lined with layer 26 is overfilled with a third conducting layer 28, typically comprising copper or other conductive materials, for example, to form conductors and to make contact to the first conductor layer 20. The resulting surface may then be planarized, using CMP or RIE, as examples, to form a planar surface 30.

Figure 4:
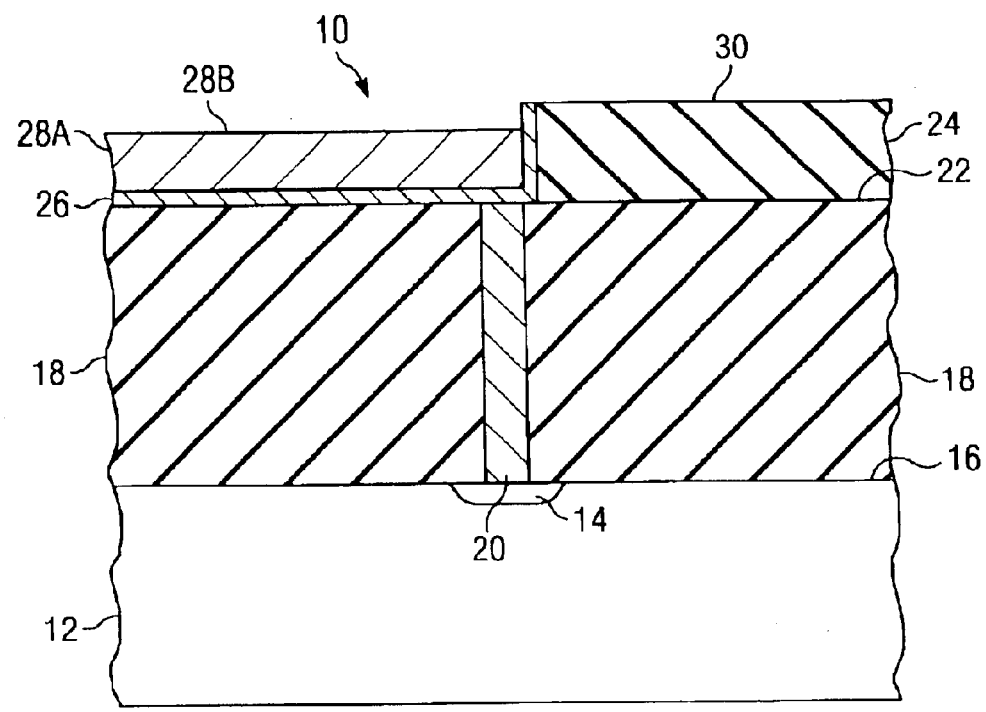

In accordance with an embodiment of the present invention, next, the third conducting layer 28 is etched to recess the third conducting layer 28 below the top surface 30 of the insulating layer 24, as shown in FIG. 4. The recessed layer 28A is preferably recessed below the insulating layer 24 top surface 30 by approximately 10–20 nm and has a top surface 28B. The liner layer 26 will be left intact if a wet chemical etch, comprising ammonium persulfate, for example, is used to recess the third conducting layer 28A, because such an etch has good selectivity for copper, whereas, the liner layer 26 will be partially or completely removed if a reactive ion etch (RIE) is used.

Figure 5:
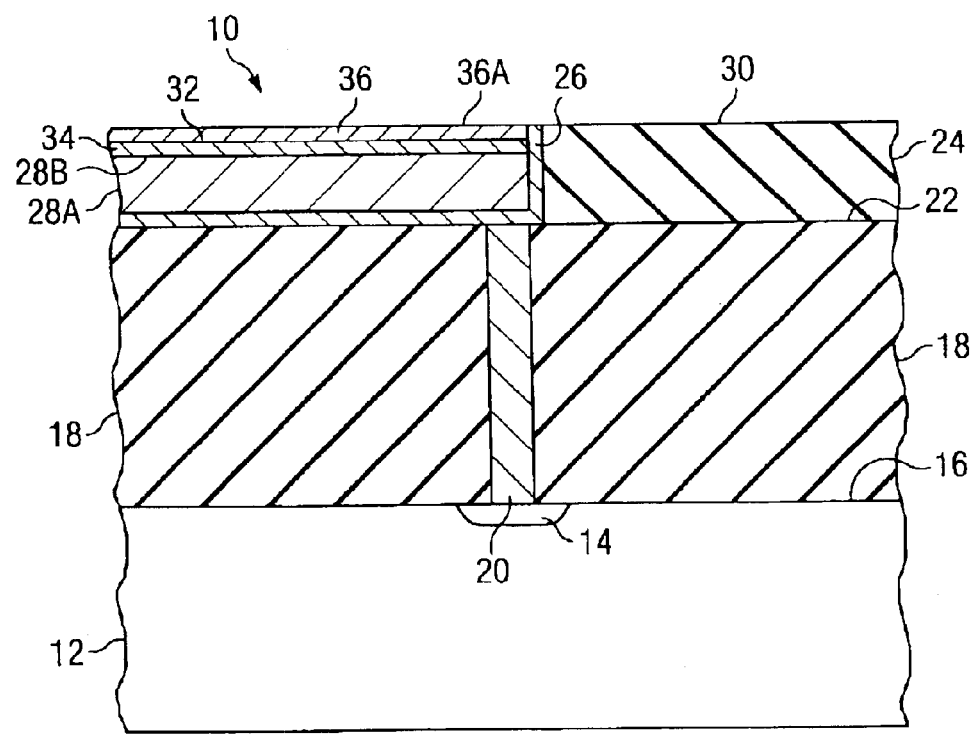

The top surface 28B of the recessed third conducting layer 28A is then covered with a catalytic activation layer 34, as shown in FIG. 5. The catalytic activation layer 34 preferably comprises of palladium (Pd) and may alternatively comprise other materials, for example. The catalytic activation layer 34 is preferably, approximately one to three atom layers thick, which is useful to activate the Cu surface. A conductive barrier layer 36, typically comprising cobalt-tungsten-phosphide (CoWP), and alternatively comprising CoWB, CoP, NiMoP, Re or Ru, as examples, is then deposited onto the top surface of the palladium layer 34 by selective, electroless deposition. Preferably the CoWP surface 36A is essentially co-planar with the surface 30 of insulator layer 24 after the selective deposition of the conductive barrier layer 36.

In an optional step, if any excess conductive barrier layer 36 and/or catalytic activation layer 34 is left remaining on the top surface 30 of the insulating layer 24, this excess material 36 or 34 may be removed a CMP or RIE process, as examples (not shown).

Figure 6:
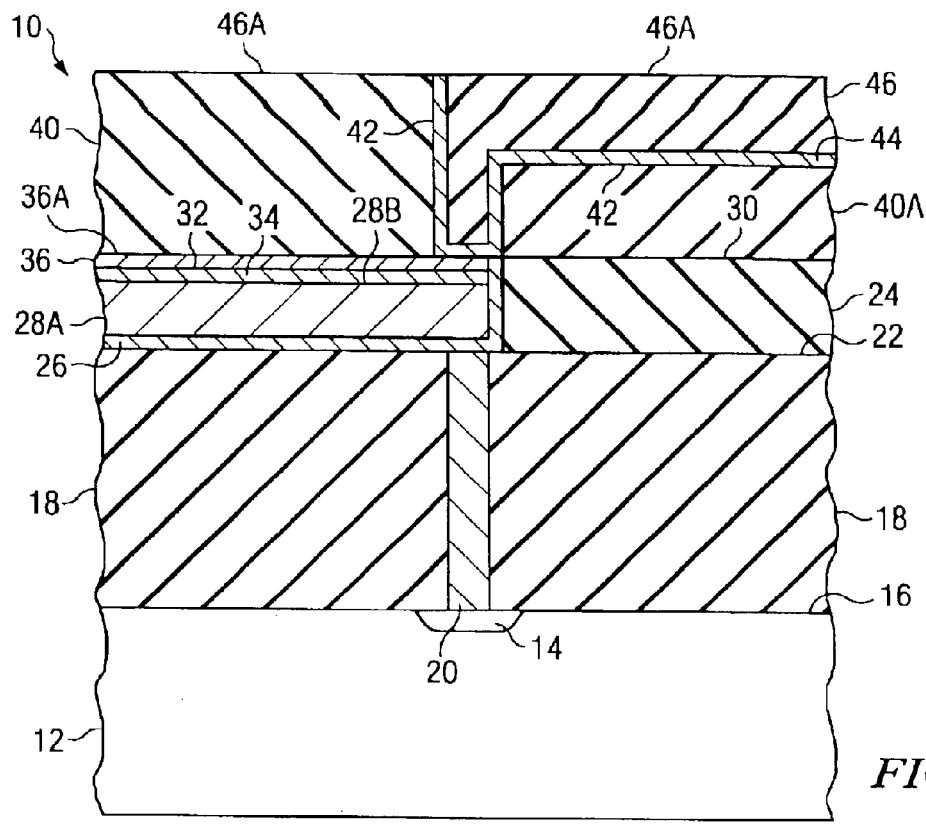
Figure 7:
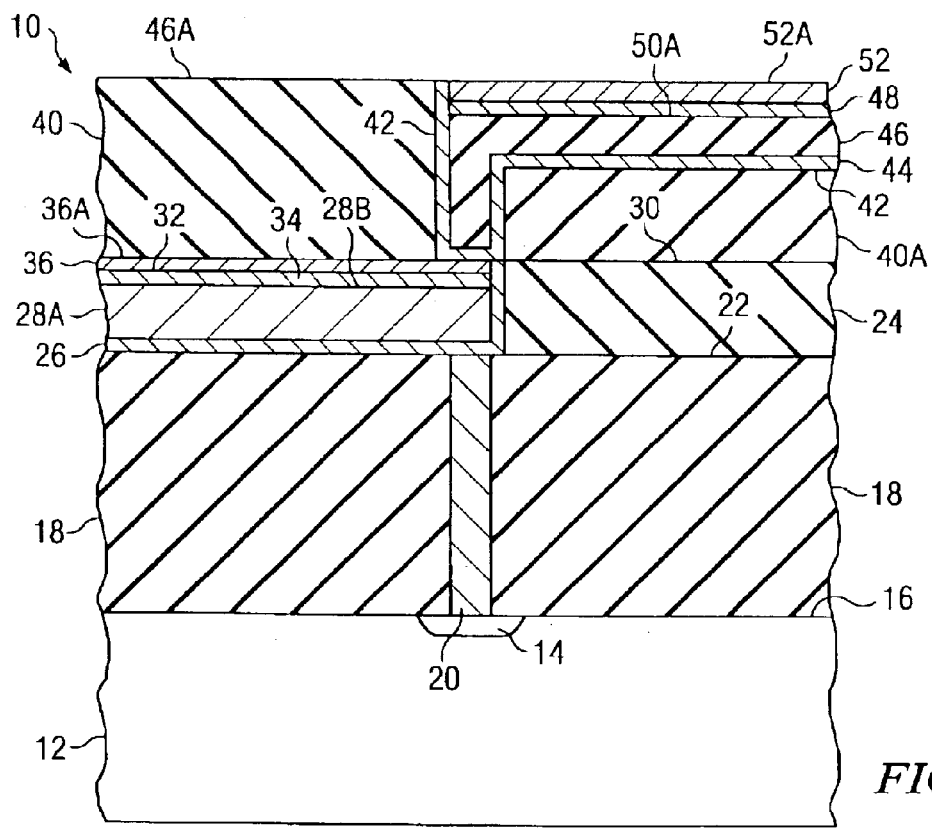
Figure 8:
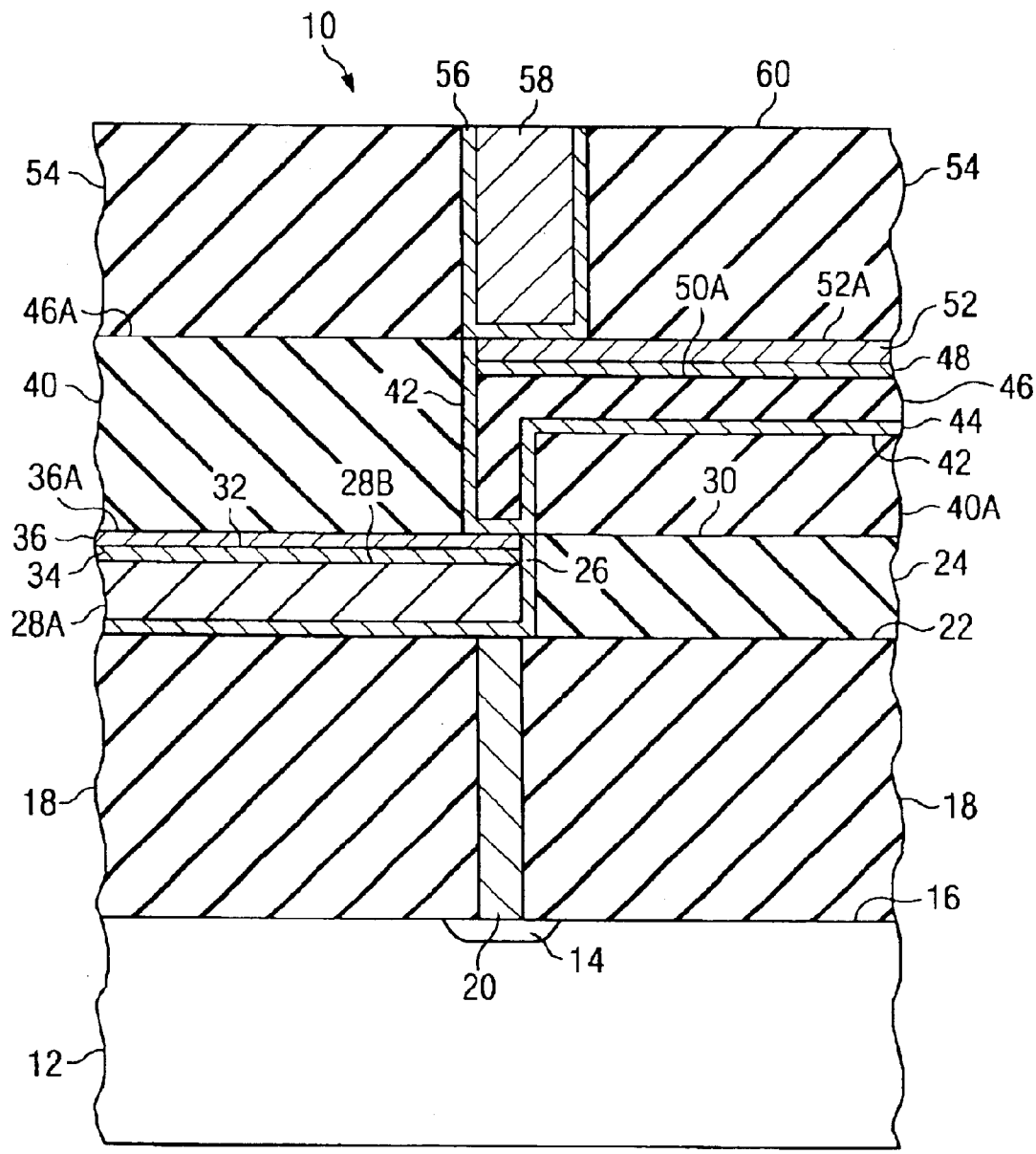

Next, additional insulating layers 40 and 54 may be deposited over the top surface 30 and 36A, as shown in FIGS. 6 through 8, to be described herein. Each conductive layer that is formed is recessed below a top surface of the insulating layer the conductive lines are formed in, and a conductive barrier layer is selectively formed over the conductive lines, leaving a top surface of the conductive lines that is co-planar with the insulating layer the conductive lines are formed in.

In particular, FIG. 6 shows a cross-sectional view of the semiconductor structure 10 as shown in FIG. 5, in which a layer 40, (a low-k dielectric material with a dielectric constant, typically about 3.7 or less), is deposited onto the essentially planar surfaces 30 and 36A. Layer 40 is etched to form a dual damascene structure resulting in both a via and trench opening, thereby creating new surfaces 42 on modified layer 40. The surfaces 42 are covered, conformally, with a liner layer 44, typically comprising TaN or TiN. Alternatively the liner 44 may comprise Ta, W, Mo, TiW, TiN, TaN, WN, TiSiN, TaSiN, or a combination thereof, for example. The via and trench openings are then overfilled with a conductive layer 46 which may comprise copper, for example, and the surface of insulating layer 40 is planarized using CMP or RIE, as examples, to form a top surface 46A.

FIG. 7 shows a cross-sectional view of the semiconductor structure 10 shown in FIG. 6, in which the Cu layer is 46 is etched, typically with a wet etch of ammonium persulfate, to form a recessed surface 50A in the Cu layer 46. An activation layer 48, typically comprising Pd, one to three atom layers thick, is then deposited to cover the recessed Cu surface 50A. A layer 52, typically comprising cobalt tungsten phosphide (CoWP), and alternatively comprising CoWB, CoP, NiMoP, Re or Ru, as examples, is selectively and electrolessly deposited onto activation layer 48 to form a new surface 52A. The thickness of CoWP layer 52 makes the surface 52A essentially co-planar with the surface 46A of layer 40. If needed, an optional additional "touch-up" CMP process may be performed on the semiconductor device 10 to remove any excess barrier layer 52 and/or activation layer 48 from the top surface 46A of the device 10.

FIG. 8 shows a cross-sectional view of the semiconductor structure 10 of FIG. 7, in which the surface 46A is covered with an insulating layer 54 which preferably comprises a low-k dielectric materials having a dielectric constant, typically of about 3.7 or less, for example. A via is formed in layer 54 and is then lined with a layer 56 of a conductor material, typically comprising TaN or TiN, as examples. Alternatively the liner 56 may comprise Ta, W, Mo, TiW, TiN, TaN, WN, TiSiN, TaSiN, or a combination thereof, for example. The via is then overfilled with a conductive material such as copper 58, and the surface is planarized using a CMP or RIE, as examples, to form surface 60.

Referring again to FIG. 1, therein is shown the resulting semiconductor structure 10 after the Cu via fill 58 has been recessed, 10–20 nm, by a wet or dry etch, as examples. The Cu surface 62 is covered with an activation layer 66, typically of Pd, which forms surface 66A. A layer 68, typically comprising CoWP, and alternatively comprising CoWB, CoP, NiMoP, Re or Ru, as examples, is selectively and electrolessly deposited onto Pd surface 66A to a thickness that makes the surface co-planar with surface 60. An inorganic insulator layer 65, typically of $SiO_2$, is then deposited onto surface 60. This is followed by the deposition of a second inorganic insulating layer 70, typically comprising silicon nitride ($Si_3N_4$), for example, onto surface 64A. Vias and trenches are formed into layer 64 and 70, and conductors are then formed in the vias and trenches to facilitate electrical contact with terminals on a package in which the semiconductor 10 is housed.

It is to be noted that the specific embodiment that has been described herein is illustrative of the general principles of the invention. Various other embodiments can be devised without departing from the spirit and scope of the invention. For example, other organic or inorganic materials can be used for the insulating layers and other materials can be used to replace the diffusion barrier materials of the liners and selective cap layers.

While only one conductive line and/or via interconnect is shown within each insulating layer in the figures, there may be many conductive lines and via connections within each insulating layer. Also, while 3 insulating layers and interconnect layers are shown in the Figures, there may be only one interconnect layer, or 8 or more interconnect layers in the semiconductor device 10, as examples. One or more of the interconnect layers may include recessed damascene conductive lines over which barrier layers are selectively formed, in accordance with embodiments of the invention.

In accordance with one embodiment of the present invention, a semiconductor device 10 includes a first insulating layer 24 formed over a substrate 12, the first insulating layer 10 being patterned with a pattern for at least one conductive line, and a first conductive material 28A disposed within the patterned first insulating layer 24, the first conductive material 28A being recessed below a top surface 30 of the first insulating layer 24. The device 10 includes an activation layer 34 disposed over the recessed first conductive material 28A, and a barrier layer 36 disposed over the activation layer 34, wherein the activation layer 34 and barrier layer 36 do not extend beyond the top surface 30 of the first insulating layer 24.

Advantages of embodiments of the present invention include the prevention of line shorting by lateral growth of the barrier layers 32, 52 and 68. Because the conductive lines 28A, 46 and 58 described herein are recessed below a top surface of the insulating layers 24, 40 and 54 they are formed in, respectively, no lateral growth of the barrier layers 32, 52 or 68 can occur during the selective formation of the barrier layers 32, 52 or 68.

An advantage of a preferred embodiment of the present invention is the introduction of a recess etch of damascene metal lines or other features to allow the deposition of a sufficiently thick selective deposited metallic cap layer without creating shorts in narrow features.

A further advantage of a preferred embodiment of the present invention is that the recess etch can be combined with an additional optional "touch-up" CMP process to remove overfill or any unintentional deposition on the dielectric material.

Moreover, the scope of the present application is not intended to be limited to the particular embodiments of the process, machine, manufacture, composition of matter, means, method and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming conductive lines of a semiconductor device, the method comprising:
   depositing a first insulating layer over a substrate;
   patterning the first insulating layer with a pattern for at least one conductive line;
   filling the first insulating layer pattern with a first conductive material;
   removing excess first conductive material from a top surface of the first insulating layer;
   recessing the first conductive material below the top surface of the first insulating layer;
   selectively forming a barrier layer over the recessed first conductive material; and
   forming a catalytic activation layer over the recessed first conductive material, before selectively forming the barrier layer.

2. The method according to claim 1, wherein the first insulating layer comprises a dielectric material with a dielectric constant of 3.7 or less.

3. The method according to claim 1, wherein the first conductive material comprises copper.

4. The method according to claim 1, wherein selectively forming a barrier layer comprises selectively forming CoWP, CoWB, CoP, NiMoP, Re or Ru, over the recessed first conductive material.

5. The method according to claim 1, further comprising forming a liner over the patterned first insulating layer, before filling the first insulating layer pattern with the first conductive material.

6. The method according to claim 5, wherein forming the liner comprises depositing a liner of Ta, W, Mo, TiW, TiN, TaN, WN, TiSiN, TaSiN, or a combination thereof.

7. The method according to claim 1, further comprising planarizing the first insulating layer to remove excess barrier layer material from the top surface of the first insulating layer.

8. The method according to claim 1, wherein recessing the first conductive material eliminates the need for the deposition of an additional cap layer over the selectively formed barrier layer.

9. A method of forming conductors of a semiconductor device having a top surface in which electrical contact areas are formal, the method comprising:
   forming a first inorganic insulating layer having a relatively high-k over the top surface;
   forming vias completely through the first inorganic insulating layer, which are in contact with the contact areas of the semiconductor device;
   filling the vias through the first inorganic insulating layer with conductive material to form conductive plugs and make contact with the contact areas;
   forming a first dielectric layer having a relatively low-k over the first inorganic insulating layer;
   forming first dielectric layer trenches in the first dielectric layer in a top surface thereof;
   lining the first dielectric layer trenches with a conductive barrier liner layer;
   filling the first dielectric layer trenches with copper to at least a level of the top surface of the first dielectric layer;
   removing a portion of the copper fill in the first dielectric layer trenches to recess the copper in the first dielectric layer trenches from the top surface of the first dielectric layer;
   forming a conductive barrier layer on a top surface of the copper in the first dielectric layer trenches, the conductive barrier layer having a lop surface that is essentially planar with the top surface of the first dielectric layer;
   forming a second dielectric layer having a relatively low-k and being of the same type as the first dielectric layer over the first dielectric layer; and
   forming second dielectric layer trenches in the second dielectric layer and lining same with a conductive barrier liner layer, copper filling, copper recessing, and forming a barrier layer over the recessed copper in essentially the same manner as was done with respect to the first dielectric layer; and
   forming a second inorganic insulating layer having a relatively high-k over a top surface of a last of the dielectric layers.

10. The method according to claim 9, wherein the first and second inorganic insulating layers have a k of 3.7 or greater and the first and second dielectric layers have a k of 3.7 or less.

11. The method according to claim 10, wherein the first and second inorganic layers are each selected from a group consisting of silicon oxide, B-doped oxide (BPSG or BSG), P-doped oxide (BPSG or PSG), and fluorine-doped oxide (FSG).

12. The method according to claim 9, wherein the conductive material filling the vias in the first insulating inorganic layer comprises tungsten.

13. The method according to claim 9, wherein the lining comprises Ta, W, Mo, TiW, TiN, TaN, WN, TiSiN, TaSiN, or a combination thereof.

14. The method according to claim 9, wherein the copper fill is deposited electrolytically.

15. The method according to claim 9, wherein the copper fill is deposited using electrolessly, CVD or PVD deposition methods.

16. The method according to claim 9, in which the copper fill over fills trenches and is planarized to the level of the top surface of the corresponding dielectric layer by chemical-mechanical polishing.

17. The method according to claim 9, wherein removing a portion of the copper is achieved via etching in an aqueous copper etching solution.

18. The method according to claim 9, wherein removing a portion of the copper fill is achieved by reactive ion etching.

19. The method according to claim 9, wherein removing the portion of the copper fill is achieved by a chemical-mechanical polish (CMP) process.

20. The method according to claim 9, further comprising applying a conductive activation layer over the top surface of the recessed copper.

21. The method according to claim 20, wherein the conductive activation layer comprises Pd.

22. The method of claim 9, wherein the conductive barrier layer is formed over the conductive activation layer.

23. The method of claim 9, further comprising a planarization process performed after forming a conductive barrier layer, to remove excess conductive barrier material from over the top surface of the first dielectric layer.

24. The method according to claim 23, further comprising applying a conductive activation layer over the top surface of the recessed copper, wherein the planarization process comprises removing a portion of excess conductive activation layer from the top surface of the first dielectric layer.

25. The method according to claim 9, further comprising:
  forming a plurality of additional dielectric layers of the same type as the first dielectric layer over the second dielectric layer; and
  forming vias and trenches in the plurality of additional dielectric layers and lining with a conductive barrier liner, copper filling, copper recessing, and forming barrier layers over the recessed copper in essentially the same manner as was done with respect to the first dielectric layer.

26. The method according to claim 25, wherein each of the dielectric layers has a k of about 3.7 or less.

27. The method according to claim 9, wherein the copper recessing eliminates the need for the deposition of an additional cap layer over the selectively formed barrier layer.

28. The method according to claim 9, further comprising:
  forming first dielectric layer vias in the first dielectric layer along with the forming of the first dielectric layer trenches in the first dielectric layer;
  lining the first dielectric layer vias with the same conductive barrier liner layer used for the lining of the first dielectric layer trenches and along with the lining of the first dielectric layer trenches; and
  filling the first dielectric layer vias with the same copper used for the filling the first dielectric layer trenches.

29. The method according to claim 9, further comprising:
  forming second dielectric layer vias in the second dielectric layer along with the forming of the second dielectric layer trenches in the second dielectric layer;
  lining the second dielectric layer vias with the same conductive barrier liner layer used for the lining of the second dielectric layer trenches and along with the lining of the second dielectric layer trenches; and
  filling the second dielectric layer vias with the same copper used for the filling of the second dielectric layer trenches.

30. A method of forming conductive lines of a semiconductor device having a top surface in which electrical contact areas are formed, the method comprising:
  forming a first dielectric layer over the top surface;
  forming vias completely through the first dielectric layer and opening to the contact areas of the semiconductor device;
  filling the vias through the first dielectric layer with conductive via material to form conductive plugs that are electrically connected to the contact areas;
  forming a second dielectric layer over the first dielectric layer;
  forming second dielectric layer trenches in the second dielectric layer in a top surface thereof;
  filling the second dielectric layer trenches with a metal comprising copper to at least a level of the top surface of the second dielectric layer;
  removing a portion of the metal in the second dielectric layer trenches to recess the metal in the second dielectric layer trenches from the top surface of the second dielectric layer;
  forming a conductive barrier layer on a top surface of the metal in the second dielectric layer trenches, the conductive barrier layer having a top surface that is essentially planar with the top surface of the second dielectric layer;
  forming a third dielectric layer over the second dielectric layer; and
  forming third dielectric layer trenches in the third dielectric layer and metal filling, metal recessing, and forming a barrier layer over the recessed metal in essentially the same manner as was done with respect to the second dielectric layer.

31. The method according to claim 30, lining the second and third dielectric layer trenches with a conductive barrier liner layer.

32. The method according to claim 30, further comprising:
  forming third dielectric layer vias in the third dielectric layer along with the forming of the third dielectric layer trenches in the third dielectric layer; and
  filling the third dielectric layer vias with the same metal used for the filling of the third dielectric layer trenches.

33. The method according to claim 32, wherein the method further comprises lining the second dielectric layer trenches, the third dielectric layer trenches, and the third dielectric layer vias with a conductive barrier liner layer.

34. The method according to claim 30, wherein the first dielectric layer has a dielectric constant of about 3.7 or greater, and wherein the second and third dielectric layers each have a dielectric constant of about 3.7 or less.

35. The method according to claim 30, further comprising:
  forming at least one additional dielectric layer above or below the second dielectric layer; and
  forming additional dielectric layer trenches in the additional dielectric layer(s) and metal filling, metal recessing, and forming a barrier layer over the recessed metal in essentially the same manner as was done with respect to the second dielectric layer.

36. The method according to claim 30, wherein the method further comprises applying a conductive activation layer over the top surface of the recessed metal prior to the forming of the barrier layer over the recessed metal.

* * * * *

UNITED STATES PATENT AND TRADEMARK OFFICE
CERTIFICATE OF CORRECTION

PATENT NO. : 6,893,959 B2 Page 1 of 1
DATED : May 17, 2005
INVENTOR(S) : Barth

It is certified that error appears in the above-identified patent and that said Letters Patent is hereby corrected as shown below:

Column 10,
Line 13, delete "formal" and insert -- formed --.
Line 39, delete "lop" and insert -- top --.

Signed and Sealed this

Twenty-seventh Day of September, 2005

JON W. DUDAS
*Director of the United States Patent and Trademark Office*